United States Patent [19]
Reuter et al.

[11] 3,766,445
[45] Oct. 16, 1973

[54] SEMICONDUCTOR SUBSTRATE WITH A PLANAR METAL PATTERN AND ANODIZED INSULATING LAYERS

[75] Inventors: James L. Reuter, East Fishkill; Jagtar S. Sandhu, Fishkill, both of N.Y.

[73] Assignee: Cogar Corporation, Utica, N.Y.

[22] Filed: Aug. 10, 1970

[21] Appl. No.: 62,260

[52] U.S. Cl. ..... 317/235 R, 317/234 F, 317/234 N, 317/235 AZ, 204/15
[51] Int. Cl. .......................... H01l 11/00, H01l 15/00
[58] Field of Search ............ 317/234, 235 E, 235 F, 317/235 J, 235 N, 235 AG, 235 AZ; 148/187; 29/586; 204/15

[56] References Cited

UNITED STATES PATENTS

| | | | |
|---|---|---|---|
| 3,351,825 | 11/1967 | Vidas | 317/235 X |
| 3,513,035 | 5/1970 | Fitzgerald et al. | 317/235 X |
| 3,518,084 | 6/1970 | Barson et al. | 317/235 X |
| 3,519,504 | 7/1970 | Cuomo | 317/235 X |
| 3,431,636 | 3/1969 | Granberry et al. | 317/235 |
| 3,576,668 | 4/1971 | Fenster et al. | 317/234 N |
| 3,584,264 | 6/1971 | McLouski | 317/234 F |
| 3,634,203 | 1/1972 | McMahon | 204/15 |

*Primary Examiner*—John S. Heyman
*Assistant Examiner*—Andrew J. James
*Attorney*—Harry M. Weiss

[57] ABSTRACT

A silicon semiconductor substrate has on its planar surface a planar multilevel metal-insulator pattern that includes at least one layer comprising conducting metal and insulating material. The insulating material is a high purity, non-porous in-situ formed compound of the metal. The pattern is formed by blanketing a predefined, apertured, insulating layer located on the substrate surface with a metal film, forming an oxidation resistant mask over the film in a pattern which mirrors a desired to-be-formed circuit pattern and anodizing the exposed conductive film in an oxidizing ambient, thereby converting the exposed portions of the metal film to an insulating medium, leaving the metal beneath the mask in a desired circuit pattern separated by and/or embedded within the insulating medium.

1 Claim, 14 Drawing Figures

INVENTORS
JAMES L. REUTER
JAGTAR S. SANDHU
BY Joseph L. Spiegel
Harry M. Weiss
ATTORNEYS

SEMICONDUCTOR SUBSTRATE WITH A PLANAR METAL PATTERN AND ANODIZED INSULATING LAYERS

BACKGROUND OF THE INVENTION

1. Field of the Invention

This invention relates to multilevel metal-insulator patterns. While not so limited, the invention finds immediate application in the formation of multilevel metal-insulator patterns such as those required in making electrical connection to integrated circuit devices located in a substrate of semiconductor material.

2. Description of the Prior Art

The integrated circuit technology is rapidly moving in the direction of greater device density, smaller conductor line widths, closer spacing of diffused regions and conductive line patterns, etc., in an effort to maximize the number of circuits in a minimum semiconductor area generally designated as a "chip." When the number of devices and circuits in a chip goes beyond a certain level in relation to semiconductor chip area, conducting patterns and interconnections cannot be limited to a single metal layer, but must be extended to multiple metal layers separated from each other by insulating or dielectric material layers.

The use of multi-layered arrangements to provide semiconductor device or circuit interconnections developed its own technical problems. For example, the major disadvantage of previous multilayered arrangements was that the resulting structure lacked planarity. After dielectric deposition or thermal oxide growth followed by photolithographic masking and etching, apertures were formed in the dielectric layer for the purpose of permitting electrical contact to be made to different conductivity type regions of the semiconductor substrate. Subsequently, a first conductive metal layer was deposited onto the apertured dielectric layer and, following photolithographic masking and etching operations, a circuit pattern was formed in the apertured dielectric layer. A second dielectric layer was then deposited, such as by evaporation, onto the first conductive circuit pattern in order to provide electrical isolation between the first conductive circuit pattern and a second conductive circuit pattern which was to be deposited and formed on the second dielectric layer. Due to the grooves or valleys and mounds created by the etched first conductive circuit pattern, the second dielectric layer was not planar and took on a wavy shape. Hence, further deposited metal and dielectric layers also were not planar. Non-planar, multilayered structures tend to create electrical shorts from one conductive layer to another due to the irregular or wavy layered configuration which sometimes does not permit a dielectric layer to fully cover an underlying conductive layer.

Recently, a publication at the IEEE Electron Device Conference in Washington, D. C. in October, 1969, entitled "A Planar Multi-Layer Interconnection" by Tsunemitsu and Shiba of the Nippon Electric Company, Ltd. described the formation of planar multilayered structures using anodic oxidation techniques. However, the process disclosed in the above referenced publication is complex, time consuming and costly because of the number of photoresist and both porous and non-porous aluminum oxide formation steps required in the process. Moreover, the metal in but one layer can be anodized using the process disclosed.

SUMMARY OF THE INVENTION

An object of the invention is the formation of a metal-insulator pattern on the planar surface of a substrate in which the planar nature of the substrate surface is maintained.

Another object is the elimination of shorting between different metal members within a multilevel metal-insulator pattern.

Still another object is a simplified procedure for forming a metal-insulator pattern on a substrate.

These and other objects are accomplished in accordance with the present invention, one illustrative embodiment of which comprises a silicon semiconductor substrate having a planar surface and a planar multilevel metal-insulator pattern formed on the planar surface of the substrate. The pattern includes a layer comprising an insulating medium and a conductive means made of metal embedded within and separated by the medium, the medium being a high purity, non-porous in-situ formed compound of the metal of the conductive means. The conductive means extends through the insulating medium to thereby expose portions of said conductive means to an outside point.

The planar multilevel-insulator pattern is formed by depositing an electrically conductive planar film over the surface of the wafer, forming an oxidation resistant mask over the film in a pattern which mirrors a desired to-be-formed circuit pattern, and anodizing the exposed conductive film in an oxygen, nitric oxide, carbon monoxide, carbon dioxide or other oxidizing ambient, thereby converting the exposed portions of the film to a high purity, non-porous insulating medium, leaving the masked portion of the film in a desired circuit pattern embedded within and separated by the medium.

BRIEF DESCRIPTION OF THE DRAWING

The foregoing and other objects, features and advantages of the present invention will be apparent from the following more particular description of the preferred embodiment of the invention as illustrated in the accompanying drawing wherein.

DESCRIPTION OF THE PREFERRED EMBODIMENTS

Figure 1A:
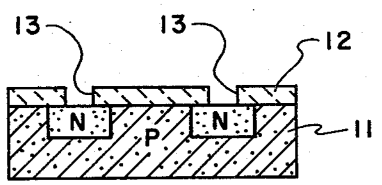
FIGS. 1A–1G are front elevational views in cross-section of a substrate of semiconductor material during successive states of formation of a planar metal-insulator pattern thereon, in accordance with the teachings of the present invention; and, FIGS. 2A–2G are front elevational views in cross-section of a substrate of semiconductor material during successive states of formation of a planar metal-insulator pattern, electrical contact being established between a first and second layer of metallization.

Referring now to FIG. 1A, there is shown a substrate 11 of semiconductor material, typically P-type silicon, upon whose surface an insulating layer 12 of, for example, silicon dioxide ($SiO_2$) has been formed. Where connections directly to N-type regions of the substrate are required, contact holes 13 are provided. A typical substrate is 15 mils thick. The insulating layer is typically 5,000 A thick. The contact hole is typically ½ mil × ½ mil and formed using a photoresist-hydrofluoric acid etch step.

Throughout this discussion reference will be had to a substrate of silicon semiconductive material. However, the substrate could be any other semiconductor material such as Ge, GaAs, GaP, etc. In addition, the substrate could be a metal such as Al, Cu, etc. Alternatively, the substrate could be an insulating material such as $Al_2O_3$, $SiO_2$, etc. This would hold especially true in the formation of multilayer printed circuit boards.

Likewise, the insulator need not be the thermally grown oxide of silicon. For example, it could be pyrolitically deposited or anodically deposited and could be some other insulating material such as aluminum oxide, silicon nitride, yttrium oxide, etc.

Figure 1E:
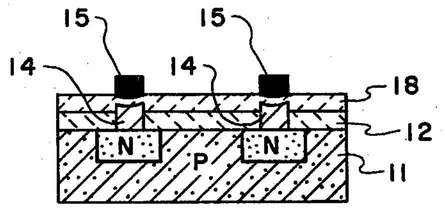
Figure 1B:
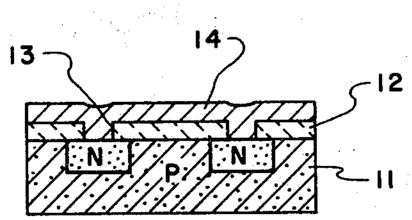

In the next operation, FIG. 1B, the entire surface of the substrate 11 is blanketed, as by vacuum deposition or sputtering, with a metal 14 completely filling the via holes 13 and forming a thick film over the insulating layer 12. This film is typically $10^{+4}$ centimeters thick.

For purposes of illustration only, the metal to be described is that of aluminum. However, the metal could be any one which is oxidizable in a field in an electrolytic medium such as tantalum, titanium, molybdenum, etc.

Figure 1F:
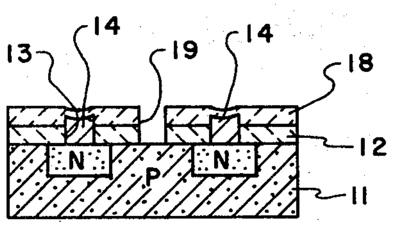
Figure 1C:
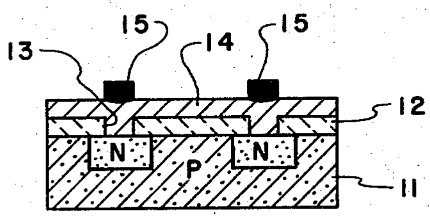

Following this, in FIG. 1C, an oxidation resistant photopolymer (positive or negative photoresist) is applied to the metal film 14, then exposed and etched so as to yield an oxidation resistant mask 15 in a pattern which mirrors a desired circuit pattern or portion thereof to be formed in film 14.

Figure 1G:
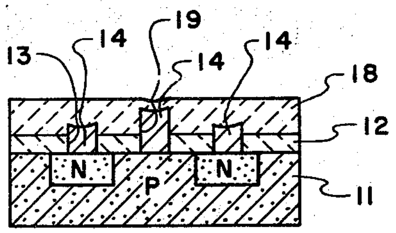
Figure 1D:
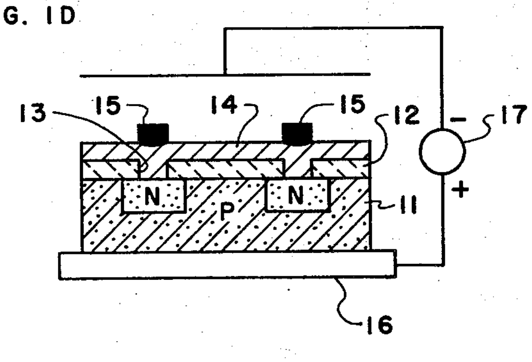

The substrate 11 is then placed on a heated plate 16 in a vacuum chamber with a low partial pressure of oxygen (FIG. 1D). The wafer is typically at a temperature of 200°–400° C during the anodization step next to take place. The partial pressure of the oxidizing medium is on the order of 0.01 to 100 Torr.

The oxidizing ambient can be oxygen preferably, water, carbon dioxide, nitric oxide or carbon monoxide, or other oxidizing media, with a reasonable vapor pressure at room temperature.

A suitable electric field is then applied across the substrate by means 17 with the substrate 11 as anode. Additionally, a means for electronic excitation can be used to provide a sufficient concentration of highly energetic, reactive species. This means could be RF, DC, microwave or ultraviolet excitation. Typical field strength is $5 \times 10^6$ volts per centimeter. In any event, the field strength should be lower than the breakdown voltage of the to-be-formed insulating medium.

Control of the oxidation rate and related parameters can be maintained by variations in field strength of either or both the anodizing or excitation conditions, substrate temperature, oxidizing medium composition and/or pressure.

The oxidation continues until the unmasked portion is completely oxidized (FIG. 1E), thereby converting that portion of film 14 to an insulating medium 18. The medium is a high purity (less than $10^{10}$ impurity ions/$cm^2$) non-porous aluminum oxide $Al_2O_3$.

The masked portion of the metallic layer is only partially oxidized due to the oxidation resistance of the masking photoresist.

After removal of the mask material (FIG. 1F), contact holes are etched as at 19 for the second layer of metal and the steps shown in FIGS. 1B–1E are repeated using the required pattern of mask material to produce at FIG. 1G the ultimately desired metal-insulator pattern on substrate 11. The final structure shown in FIG. 1G can be utilized as a dual diode or NPN device.

Referring now to FIG. 2, the teachings of the present invention are applied with respect to the formation of electrical contact between the first and second levels of a multilevel metal-insulator pattern.

Figure 2A:
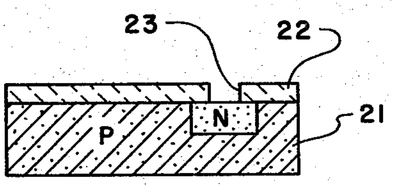
Figure 2E:
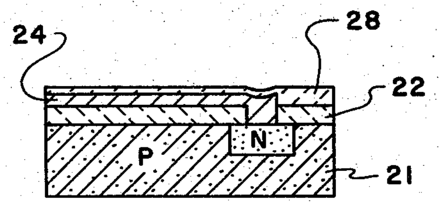

FIG. 2A illustrates a P-type substrate 21 of semiconductive material, upon whose surface an insulating layre 22, typically $SiO_2$, is formed. Contact holes directly to N-type regions of the substrate 21 are formed at 23.

Although the teachings of the present invention are used to best advantage in the formation of complex integrated circuit devices within a semiconductor substrate, only a single N-type region is illustrated for ease of understanding.

Figure 2B:
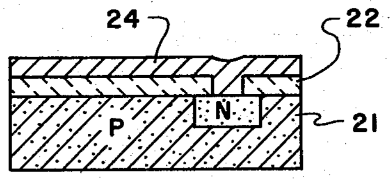

In the next operation, FIG. 2B, the substrate 21 is covered with a metal, 24, filling contact holes 23 and forming a thick film over the insulating layer 22.

Figure 2F:
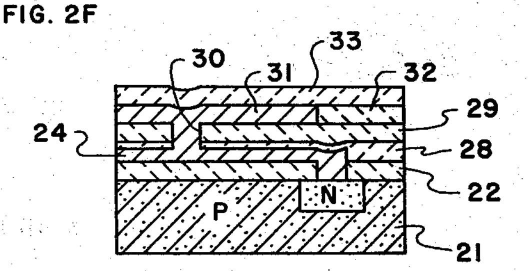
Figure 2C:
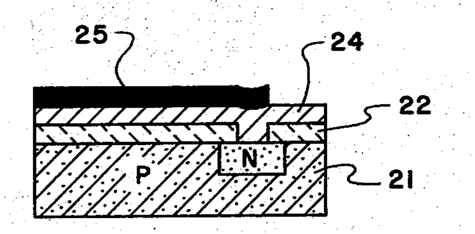
Figure 2G:
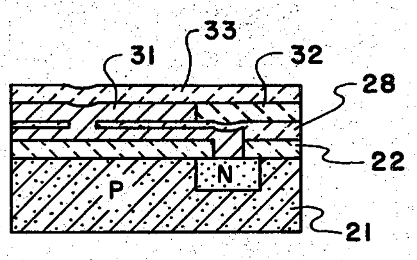
Figure 2D:
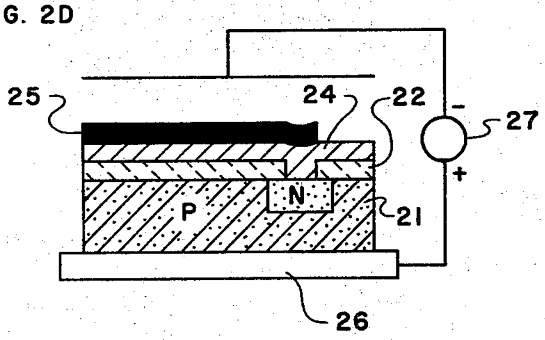

Following this, in FIG. 2C, a negative photoresist is applied to film 24, then exposed and etched so as to yield an oxygen resistant mask 25.

The wafer is then placed on a heated plate 26 in a vacuum chamber with a low partial pressure of oxygen, and a suitable electric field applied through means 27.

Anodization continues until the unmasked portion is completely converted to an insulating medium 28 while only a portion of the masked film is converted. The mask material is now removed.

In the next operation, FIG. 2F, a passivating layer 29, for example, sputtered quartz, may be deposited on the metal-insulator pattern formed on the surface of substrate 21. When connections to the first layer of metallization 24 are required, via holes are formed as at 30.

Thereafter the entire surface is blanketed with a second metal film 31, completely filling via hole 30 and forming a thick film over sputtered quartz layer 29.

Alternatively, deposition of passivating layer 29 can be eliminated completely. That is, the second metal film 31 can be applied directly to the first film, with the anodized portions of film 24 acting as the insulating medium between the metal portion of film 24 and the metal of film 31, where desired.

Following this, selective anodization may be repeated, as in steps 2C–2E, if desired, as at 32 to complete the metal-insulator pattern, while maintaining its planar topology. In this step the partial anodization of the film beneath the oxygen mask could be eliminated by proper choice of process parameters, as by thickening the oxide mask, increasing its density, etc.

Finally an insulating material 33 such as quartz, is applied to the entire top surface for passivating same.

While the invention has been particularly shown and described with reference to the preferred embodiment thereof, it will be understood by those skilled in the art that changes in form and detail and omissions may be made therein, without departing from the spirit and scope of the invention.

What is claimed is:

1. A semiconductor structure comprising, in combination, a silicon semiconductor substrate having a planar silicon dioxide layer located on a surface of said substrate;

an anodized aluminum oxide layer having a planar top surface and a bottom surface in contact with said silicon dioxide layer;

a first aluminum layer having portions thereof in contact with portions of said substrate and extending upwardly from the substrate surface through said silicon dioxide layer and into said aluminum oxide layer, said first aluminum layer having a top surface which is below the planar top surface of said aluminum oxide layer;

a first protective insulating layer having a bottom surface in contact with said planar top surface of said aluminum oxide layer;

a second aluminum layer having at least one portion in contact with said first aluminum layer and having a planar bottom surface portion in contact with said planar top surface of said first protective insulating layer; a second anodized aluminum oxide layer in contact with said second aluminum layer and said first protective insulating layer; and a second protective insulating layer located on said second aluminum layer and said second anodized aluminum oxide layer.

* * * * *